United States Patent
Marshall et al.

(10) Patent No.: US 6,307,726 B1
(45) Date of Patent: Oct. 23, 2001

(54) SYSTEM TO CONTROL THE OUTPUT CURRENT WITH TEMPERATURE THROUGH A CONTROLLABLE CURRENT LIMITING CIRCUIT

(75) Inventors: Andrew Marshall, Dallas; Ching L. Lin, Richardson; Jingwei Xu, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/410,841

(22) Filed: Oct. 1, 1999

(51) Int. Cl.$^7$ ....................................................... H02H 3/00
(52) U.S. Cl. ......................... 361/93.9; 361/93.1; 361/93.8
(58) Field of Search ................................ 361/93.1, 93.7, 361/93.8, 93.9, 100, 103; 257/288, 360; 323/907; 327/512, 530, 538, 560

(56) References Cited

U.S. PATENT DOCUMENTS

| | | | |
|---|---|---|---|
| 3,796,943 | * 3/1974 | Nelson et al. | 323/277 |
| 4,021,701 | * 5/1977 | Davies | 361/18 |
| 4,787,007 | * 11/1988 | Matsumura et al. | 361/98 |
| 4,937,697 | * 6/1990 | Edwards et al. | 361/18 |
| 5,006,949 | * 4/1991 | Guajardo | 361/18 |
| 5,485,341 | * 1/1996 | Okado et al. | 361/98 |
| 5,684,663 | * 11/1997 | Mitter | 361/106 |
| 5,959,464 | * 9/1999 | Qualich | 324/769 |

* cited by examiner

Primary Examiner—Kim Huynh
(74) Attorney, Agent, or Firm—Alan K. Stewart; Wade James Brady, III; Frederick J. Telecky, Jr.

(57) ABSTRACT

A controllable current limiting circuit (30) that, when used with a low precision current limiting circuit (10), will limit the current of the output driver transistor M1 to a relatively flat response over a broad temperature range. The current is limited by setting the voltage across a resistance, R1, to a certain value. To overcome temperature induced variations in this voltage, the compensation circuit (20) generates a current that varies with temperature. This current is injected into a terminal of the resistance, R1. This current is generated in such as a manner to ensure that the current flowing in the output driver transistor M1 is relatively constant over a wide temperature range.

6 Claims, 2 Drawing Sheets

SYSTEM TO CONTROL THE OUTPUT CURRENT WITH TEMPERATURE THROUGH A CONTROLLABLE CURRENT LIMITING CIRCUIT

BACKGROUND OF THE INVENTION

1. Field of the Invention

This invention relates to improvements to the precision in limiting the output current of a semiconductor device over a broad temperature range through the use of a compensated current limiting circuit.

2. Brief Description of the Known art

It is necessary for semiconductor devices such as integrated circuits to operate over a broad temperature range. A typical temperature range for military applications is −40 degrees centigrade (deg. C.) to +125 deg. C., while many industrial applications require that the integrated circuit (IC) operate within specifications from −40 to +100 deg. C. Special applications, such as automotive, require that the IC operate over a temperature range of −40 to +125 deg. C.

A current limiting circuit is designed to sink (or source) a specified maximum output current from (or to) a load. It is necessary that this current remains below a certain specified design level so that no damage to either the circuit, chip, bond wire or device package occurs. Also excessive current can damage the load being driven. This is particularly important for devices where the output current in normal operation is relatively high, i.e., in the ampere range and above. Excessive current can occur in a device when something abnormal happens to the load, such as a stalled motor or a short to supply. As an example, micro controllers are used to control DC motors such as stepper motors. If the controller fails, excessive current can occur and could damage the motor windings.

A packaging design approach to manufacturing higher current IC's is to use multiple wires on the lead frame and multiple pads on the chip to a single contact. A 1 mil bond wire will reliably carry one ampere DC, but typically fuses at 1.2–1.8 amperes. Therefore, an IC that carries three amperes under normal operation may use three, 1 mil wires between the lead frame and bond pads. A larger 1.3 mil wire will carry two amperes, but will fuse in the 2.5–3.5 ampere range. The IC output current must be limited to a current below the level that will destroy or damage the bond wires, the chip or the load, either in normal or abnormal operations over the required temperature range.

The circuit in FIG. 1 shows the conventional method used to solve the problem of excess current in the load circuit of the device. This conventional low precision current limiting circuit is simple and economical. It is also very stable because of the low loop gain. It has the desired fast (less than 300 nsec.) response to limiting output current when excessive current is sensed in the output MOSFET. The problem with the conventional circuit is that, over a broad temperature range, the current limiting capability has a wide variation. As an example, in the embodiment discussed later, the variation of output current limiting is 130% going from approximately 600 ma. at +150 deg. C. to 1400 ma. at −50 deg. C. The negative slope at high temperatures is useful as will be discussed later. The desired temperature characteristic, however, would be a flat or relatively flat current limiting characteristic over a broad range and changing to a negative slope at a specific high temperature and beyond.

The operation of the conventional current limiting circuit of FIG. 1 is as follows. M1 is the output MOSFET transistor in which the current is being controlled. The MOSFET is but one type of a broader class of insulated gate field effect transistors (IGFETs). The balance of the circuit, shown within the dotted lines is the conventional current limiting circuit. M2 is a sensefet and may be any area ratio with respect to M1. In a typical case, it is approximately $\frac{1}{100}$ the area of M1, but made in the same MOS process as M1, with the same temperature characteristics except scaled for size. The area of the sensefet can be varied depending on the current amplification desired. The ratio of the current in the two transistors varies in proportion to the ratio of the areas of the two devices.

$$\frac{\text{Current in } M1}{\text{Current in } M2} = \frac{\text{Area of } M1}{\text{Area of } M2}$$

As the current in M1, at node N1, reaches the maximum design current, the voltage at node N2 reaches the base-to-emitter "on" voltage ($V_{beon}$) of the transistor T1, and the transistor turns on. This reduces the voltage at node N3 to $V_{ceon}$, lowering the gate voltage of the output MOSFET at node N3, thereby maintaining the current through M1 below the design maximum. In a typical embodiment, R1 might be 70 ohms. The current limiting level of the current limiting characteristic can be modified by the value of this resistor. Increasing R1 will lower the current limiting capability (increase the current limit) and lowering the resistor will have the opposite effect. R2 is a polysilicon 10 K ohm resistor. The size is determined by the normal operational response required and minimization of the RF or EMI generated by the circuit pulses. In a typical embodiment, an acceptable operation response time is 300–700 nsec. The V drive is a reference voltage and is generally in the 0–15 volt range.

The low precision current limiting circuit has proven very effective when the operating temperature range is limited. The serious drawback of the circuit is that it is highly dependent on temperature and exhibits unacceptable variation in its current limiting capability over a broad temperature range as shown in Table 1. The $V_{beon}$ of transistor, T1, typically has a negative temperature coefficient of 1.8 mv./ deg. C., and the resistor, R1, has a positive temperature coefficient of approximately 1000 ppm/deg. C. Depending on the process, both the transistor and resistor coefficients will vary, but the values given above are representative. As the operating temperature increases, the $V_{beon}$ of the transistor, T1, is reduced and the transistor turns on at a lower voltage, hence lowering the voltage at node N3. The maximum current limited output at M1 is lowered. As the temperature is reduced, the opposite effect occurs and the maximum current limited output at M1 increases.

TABLE 1

| Temperature (deg. C) | $V_{beon}$ (T1) @ N2 (volts) | Resistor, R1 (ohms) | Current @ M2 (ma) | Current @ M1 (amperes) |
|---|---|---|---|---|
| 175 | 0.42 | 80 | 5.3 | 0.53 |
| 100 | 0.56 | 75 | 7.5 | 0.75 |
| 25 | 0.70 | 70 | 10.0 | 1.00 |
| −50 | 0.84 | 65 | 12.9 | 1.29 |

In Table 1:

Column 1 gives the ambient temperature of the circuit.

Column 2 is the Vbeon of transistor T1. The values given are for a negative temperature coefficient of 1.8 mv./deg. C.

Column 3 is the temperature dependent resistance of resistor, R1, with a positive temperature coefficient of approximately 1000 ppm/deg. C.

Column 4 is the current through the sensefet, M2, and is calculated as:

$I_{M2}=V_{beon}/R1$.

Column 5 is the through the drive MOSFET, M1, and is calculated as:

$I_{M1}=I_{M2}\times 100$ (current mirror amplification)

As can be seen from Table 1, the variation in current limited value, when only using the conventional circuit, is large over a broad temperature range varying from 0.53 amperes at +175 deg. C. to 1.29 ampers at −50 deg. C. This calculated data compares favorably with the chart that shows actual measured data in FIG. 5. These large variations are very difficult and expensive for circuit designers to overcome.

SUMMARY OF THE INVENTION

The invention uses the best characteristics of the low precision current limiting circuit of FIG. 1 in combination with a new compensation circuit to achieve essentially a flat or controlled current limited output response from the output MOSFET over a wide variation of operating temperature. The compensation circuit develops a current that varies with temperature in a specific manner. This current, which is injected into resistor, R1, serves to compensate for temperature induced variations in the $V_{beon}$ of transistor, T1, and the resistance of resistor, R1. The result is that, over a significant range of temperatures, the output current of the transistor, M1, remains relatively constant.

The invention provides a controllable current limiting function that, when used with a low precision current limiting circuit, will limit the current of the output driver transistor M1 to a relatively flat response over a broad temperature range. This response is important because excess current can cause damage to the device, device package and/or load. The current is limited by setting the voltage across a resistance, R1, to a predetermined value. To overcome temperature induced variations in this voltage, a compensation circuit 20 generates a current that varies with temperature. This current is injected into a terminal of the resistance, R1. This current is generated in such a manner as to ensure that the current flowing in the output driver transistor M1 is relatively constant over a wide temperature range.

DETAILED DESCRIPTION OF THE INVENTION

Figure 1:
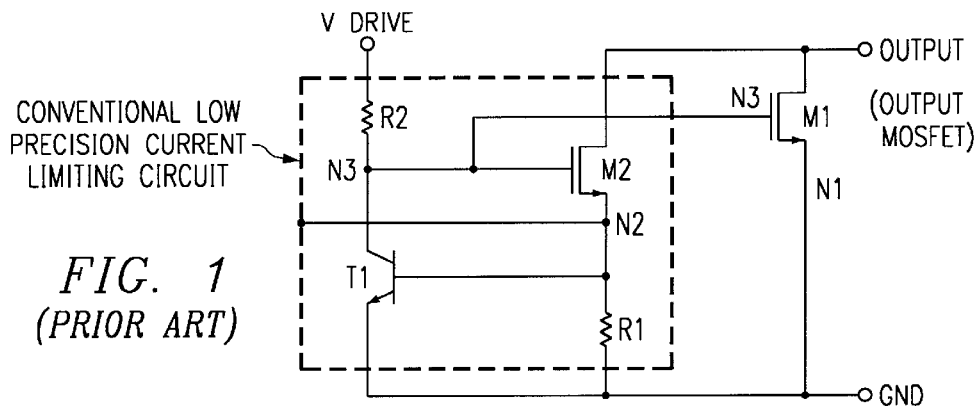
FIG. 1 is the circuit diagram of a known art low precision current limiting circuit used to control the maximum output current of the MOSFET M1.
Figure 2:
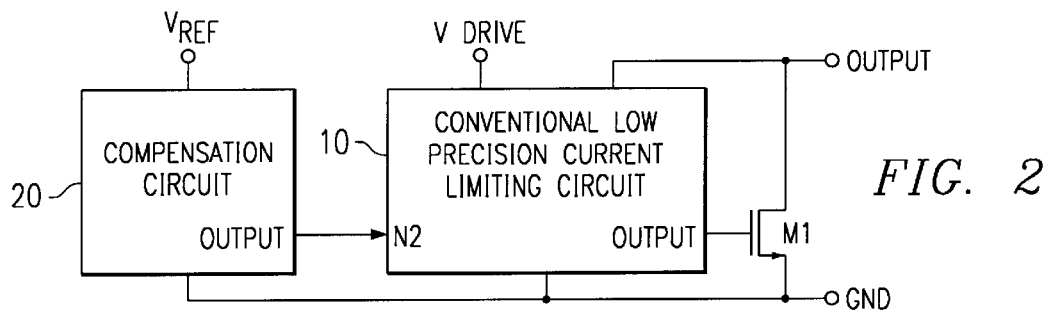
FIG. 2 is a functional block diagram of the preferred embodiment of the invention.

FIG. 2 is a block diagram showing the combination of a low precision current limiting circuit with a compensation circuit for generating the desired compensation current. One type of low precision current limiting circuit 10 in combination with output transistor, M1, has been shown in greater detail in FIG. 1. Compensation circuit 20 serves to generate the compensation current which appears at its output and is, in turn, coupled to a terminal of resistor, R1, in the low precision current limiting circuit 10. While compensation circuit 20 is shown to be coupled to a voltage, $V_{REF}$, and low precision current limiting circuit 10 is shown to be coupled to a voltage, $V_{drive}$, both these voltages may be generated from the same supply voltage.

Figure 3:
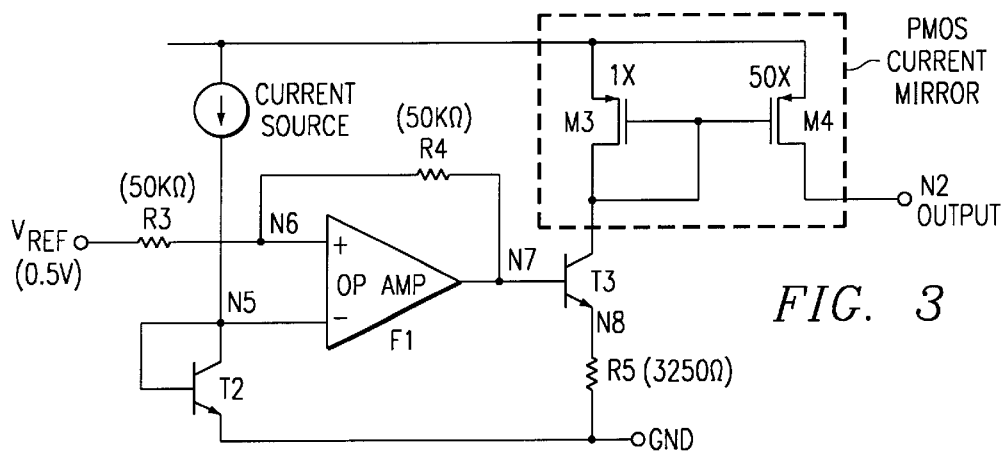
FIG. 3 is a circuit diagram of a compensation circuit according to the present invention.

FIG. 3 is the schematic diagram showing the details of compensation circuit 20. In this circuit, F1 is an operational amplifier (op amp). For the purposes of this circuit, op amp F1 can be considered an ideal op amp. (See Ahmed & Spreadbury, "Operational Amplifiers and Linear Integrated Circuits, pp 114–120; Analogue and Digital Electronics for Engineers—an Introduction, 2nd Edition (1984) Cambridge University Press).

Transistors T2 and T3 are NPN transistors with equivalent current density. Transistor T2 is small relative to transistor T3 and is used to establish the $V_{beon}$ voltage level, whereas T3 is designed for the current desired through resistor R5 and the amplification of the current mirror used. R3 and R4 are polysilicon resistors and are both 50 K ohms. The size is determined to minimize the power dissipation in the circuit while providing the feedback circuit (R4) for op amp, F1, and limiting the input current (R3) to op amp, F1. R5 is a polysilicon resistor that defines the precise level and slope of the current limiting response and is the same type resistor as R1 in FIG. 1 (same process and equivalent temperature coefficients). In this way these two resistors will track each other as the ambient temperature varies. M3 and M4 are the active devices in the configuration shown as a standard PMOS current mirror for amplification of the output current of transistor, T3. In this case, a factor of 50 current amplification is used. (See Wai-Kai Chen, "Simple Current Mirror". pp 1620–21, The Circuits and Filters Handbook (1995), CRC/IEEE Press.)

The current source can be any well known universal current source, typically generated on ICs. Typically, the current value is in the 5–20 microamp range. The precise value is determined by the desired speed of operation and the power dissipation. Operation of the compensation circuit is straightforward. The end result is to generate a temperature dependent output current from the output in FIG. 3 that is injected into node N2 of the low precision current limiting circuit of FIG. 1. The current offsets the temperature dependent variation of the low precision current limiting circuit, particularly $V_{beon}$ of transistor, T2, by modifying the current through resistor, R1.

Again with reference to FIG. 1, at a given temperature, and at current limiting, the voltage drop across resistor R1 is the $V_{beon}$ of transistor, T1 and constant. The current through resistor, R1, is a combination of $I_{M2}$, the current through transistor, M2, and the current injected into node, N2, from compensation circuit 20 ($I_{out}$). Therefore:

$V_{beon}=(I_{M2}+I_{out})\times R1$.

Figure 4:
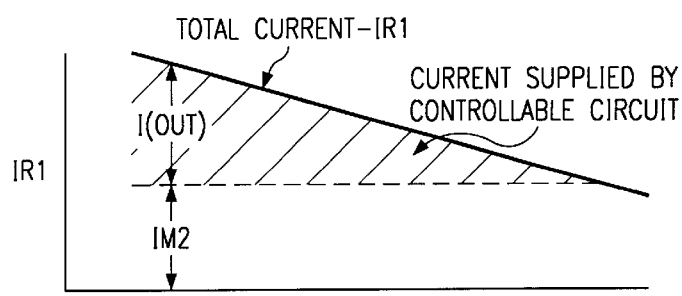
FIG. 4 is a graph of the varying level of the compensation current as a function of temperature.

The current through resistor, R1, ($I_{R1}$) has a negative temperature characteristic and is conceptually shown in FIG. 4. It is seen that, for a substantial range of temperatures, the current in transistor M2 is constant while the negative temperature characteristic is provided by the current supplied by compensation circuit 20 (shown by the shaded area). Stated differently, the desire is to maintain a flat current limiting response at transistor M1 over a substantial temperature range. This requires a flat current through transistor, M2. Since the total current in resistor, R1, increases with decreasing temperature because of the temperature coefficient of the; $V_{beon}$ of transistor, T1, this temperature dependent current increase is supplied by compensation circuit 20. The end result is that holding the current in transistor M2 constant with temperature holds the maximum current limit for MOSFET M1 relatively constant.

Above a preselected temperature, the low precision current limiting circuit 10 overrides the effects of compensation circuit 20 and the current limited response of the output mosfet, M1, follows the negative current limited response of circuit 10. This override is a desirable feature that reduces possible damage to the device and/or package because of high power dissipation during current limiting at high temperatures.

In compensation circuit 20, the voltage at node N5 is the $V_{beon}$ of transistor, T2. The voltage at node N6 is the same as at node N5 because of feedback around op amp, F1. The output voltage at node N7 is therefore $V_{beon}+V_{beon}-V_{REF}$. The output voltage at node N7 is therefore $V_{beon}-V_{REF}$ (assuming that the $V_{beon}$ for transistors, T2 and T3, track each other with temperature). This voltage defines the current through resistor, R5. This current is then appropriately amplified in the PMOS current mirror (M3 & M4) to the output. The current gain of the current mirror is designed for 50 to 1 amplification, although other values might be used depending on the circuit requirements. The specific slope of the current limited response desired determines the value of resistor R5. The value of 3250 ohms was selected because the desired response was a flat current limited response of approximately 600 ma. from the output MOSFET, M1, over a temperature range of −40 deg. C. to +150 deg. C. With values of resistor, R5, above 3250 ohms, a negative slope of current limited output is experienced with temperature (see FIG. 5). With values of resistor, R5, less than 3250 ohms the expected current limiting response has a slight positive to flat response versus temperature.

Figure 5:
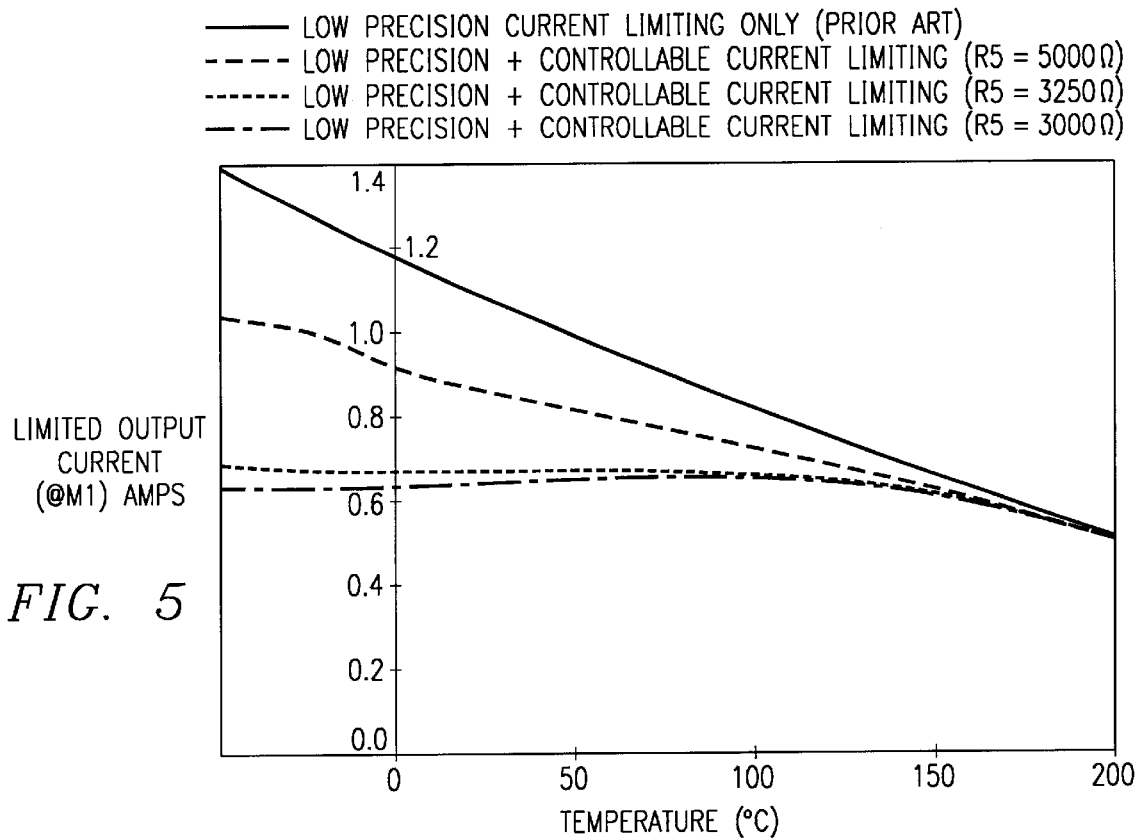
FIG. 5 is a graph of the actual current limited output of a circuit versus temperature using different current limiting options.

The reference voltage selected is 0.5 volts. The reference voltage determines at what temperature and above the low precision current limiting circuit 10 overrides the compensation circuit 20. In this design, the reference voltage was set at 0.5 volts which defines the intersect point at approximately +150 deg. C. (FIG. 5).

In the operation of the compensation circuit 20 as temperature increases, when compared to operation at 25 deg. C., the $V_{beon}$ of transistor T2 decreases. Hence the voltage at node N8 decreases. As noted previously, the voltage at node N8 equals $V_{beon}-0.5$ volts. This reduces the output current that is injected into node N2 of the low precision current limiting circuit 10. At the same time, as a result of the increasing temperature, the $V_{beon}$ of transistor, T1, is also decreasing thereby resulting in a reduction in the total current flowing through resistor, R1. The reduction in the current injected by the compensation circuit 20 is designed to just match this reduction in the current through resistor, R1, so that the current flowing in transistor M2 remains constant.

Conversely, as the temperature decreases, the $V_{beon}$ of transistor, T2, increases, increasing the voltage at node N8 and the current through resistor, R5. This current is then amplified and injected into node N2 thereby increasing the current through resistor, R1 and holding the current in transistors, M1 and M2 constant.

To summarize the operation of the circuit at various temperatures, Table 2 shows the voltages and currents at selected locations of compensation circuit 20 as illustrated in FIG. 3.

TABLE 2

| Temperature (deg. C) | $V_{beon}$ (T2) (volts) | V (N8) (volts) | R5 (ohms) | $I_R$ (microamps) | $I_{out}$ (M4) (ma.) |
|---|---|---|---|---|---|
| 175 | 0.42 | 0.0 | 3750 | 0 | 0 |
| 100 | 0.56 | 0.06 | 3500 | 17 | 0.86 |
| 25 | 0.70 | 0.20 | 3250 | 62 | 3.10 |
| −50 | 0.84 | 0.34 | 3000 | 113 | 5.60 |

In Table 2:

Column 1 is the ambient temperature of the circuit.

Column 2 is the $V_{beon}$ of transistor, T2, at node, N5. The temperature coefficient of transistor, T2, is negative and 1.8 mv./deg. C.

Column 3 is the voltage at node, N8, the voltage across resistor, R5, and is given by:

$V(N8)=V_{beon}$ (T2)$-V_{REF}$ where $V_{REF}$ is 0.5 volts.

It should be noted that, at 175 deg. C., the calculation produces a negative number. The voltage at Node, N8, cannot go negative. Therefore, the entry in column 3 for this temperature is zero. In fact, the temperature at which $V_{beon}$ for transistor, T2, is equal to $V_{REF}$ is the temperature above which the low precision current limiting circuit 10 overrides the compensation circuit 20. $V_{REF}$ can be modified to select the temperature at which this intersection occurs. Increasing the reference voltage will reduce the temperature at intersection and decreasing the reference voltage will increase the intersection temperature.

Column 4 gives the value of resistor, R5, at various temperatures. The resistor has a positive temperature coefficient of 1000 ppm/deg. C., the same as resistor, R1. By design, these two resistors track over temperature.

Column 5 is the current through resistor, R5, and is given by:

$I_{R5}=V(N8)/R5$

Column 6 is the output current from the compensation circuit that is injected into node N2 of low precision current limiting circuit 10. Its value is calculated by:

$I_{out}=I_{R5}\times 50$ (gain of the current multiplier) Table 3 shows voltages and/or currents at the key nodes in FIG. 1 for low precision current limiting circuit 10 during current limiting over temperature when used in conjunction with compensation circuit 20 as shown in FIG. 2.

TABLE 3

| Temperature (deg. C) | R1 (ohms) | $V_{R1}$ (volts) | $V_{beon}$ (T1) (volts) | VILT (N2) (volts) | I (M2) (ma) | I (M1) (amperes) |
|---|---|---|---|---|---|---|
| 175 | 80 | 0 | 0.42 | 0.42 | 5.25 | 0.53 |
| 100 | 75 | 0.065 | 0.56 | 0.49 | 6.53 | 0.65 |
| 25 | 70 | 0.20 | 0.70 | 0.50 | 7.14 | 0.71 |
| −50 | 65 | 0.36 | 0.84 | 0.48 | 7.38 | 0.74 |

In Table 3:

Column 1 is the ambient temperature of the circuit.

Column 2 is the resistance of resistor, R1.

$V_{R1}$ in column 3 is that portion of the voltage drop across resistor, R1, resulting from the injection of the output current, $I_{out}$, (Table 2, column 6) from compensation circuit 20 into Node N2, of low precision current limiting circuit 10. This voltage is given by the computation:

$V_{R1}=I_{out}\times R1.$ $V_{beon}$ in column 4 is the threshold voltage of transistor, T1. By design, transistors T1 and T2 have the same temperature coefficients so they will track with temperature.

VILT in column 5 is the net current limiting voltage at node N2 and is calculated as:

$$VILT(N2) = V_{beon}(T1) - V_{R1}.$$

As can be seen,, this net voltage is the result of the difference between the $V_{beon}$ of transistor, T1, and the voltage drop across resistor, R1, caused by the injection of the current from compensation circuit 20.

Column 6 is the resulting current in transistor, M2, the sensefet. It is calculated as:

$$IM2) = VILT(N2)/R1.$$

Column 7 shows the resultant current limited output current at the output transistor, M1, and is:

I1)=I(M2)×50 (the current amplification between M1 and M2). As noted earlier, the amplification of current between transistors, M2 and M1, is the same ratio as their respective areas.

The slope of the current limited output, versus temperature, can be controlled to have a positive, negative or flat response. As a result of the injection of the compensation current at node N2 of FIG. 1, the current flowing through transistor, M2, is substantially flat over a wide range of temperatures.

FIG. 5 is a graph of the measured limited output current at transistor, M1, as a function of temperature using four different configurations. These are 1) uncorrected low precision current limiting, and 2) current limiting with compensation circuit 20 using three different values of resistance for resistor, R5. As can be seen using the uncorrected circuit only, a wide variation of current limiting occurs (130% from +150 deg. C. to −50 deg. C.). When compensation circuit 20 is used, particularly with resistance values of resistor, R5, set to 3250 ohms or 3000 ohms, the current limiting response is controlled to the desired flat output of the output MOSFET, M1, over the wide desired temperature range; in this case from −50 deg. C. to approximately +150 deg. C. Also, at +150 deg. C. and above, the current limited output shows the uncompensated circuit overriding the compensation circuit and following the negative slope. This is desirable since, at temperatures above +150 deg. C., the device dissipation needs to be minimized to avoid thermal shutdown or damage to the device.

Figure 6:
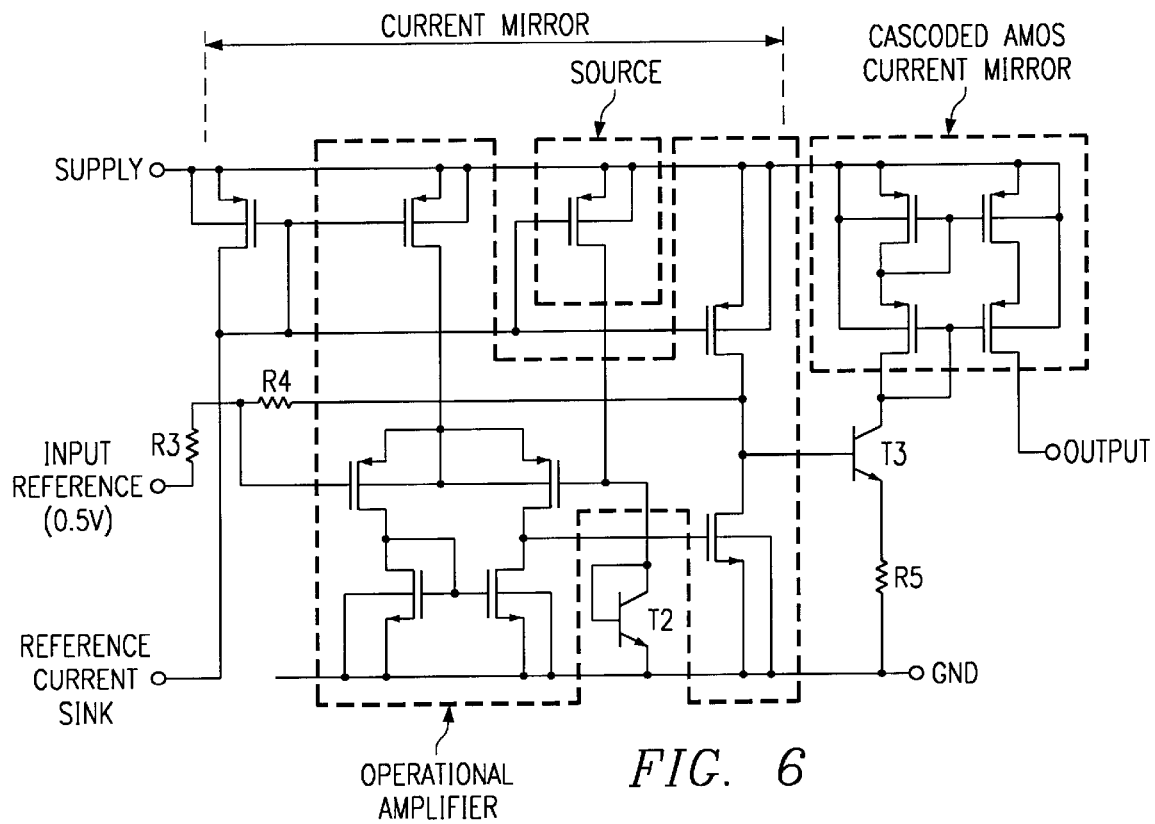
FIG. 6 is a circuit diagram of the implementation of the preferred embodiment of the current limiting function.

FIG. 6 is a schematic diagram of the circuit used in the preferred embodiment of compensation circuit 20. Subject to previously noted constraints (e.g., the need to have the threshold voltages of transistors, T1 and T2 track each other), the choice of transistors in this circuit are a matter of design choice in light of the particular application involved.

Thus there is provided a compensated current limiting circuit which provides a relatively constant controlled output current over a significant range of temperatures. While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention that fall within the true spirit and scope of the invention.

We claim:

1. A current limiting circuit comprising:

(a) a first IGFET for conducting a current, the largest amplitude of which is to be limited to a preselected value, (b) a resistance operatively connected to a source of said IGFET, (c) a circuit for limiting the voltage across said resistance, and (d) a compensation circuit for injecting a compensation current into a terminal of said resistance, said compensation current being adapted to correct for temperature induced variations in the output of said current limiting circuit, (e) a second IGFET wherein said first IGFET is a sensefet of said second IGFIT, the current in said second IGFET being greater than the current in said first IGFET.

2. The current limiting circuit of claim 1 wherein said circuit for limiting the voltage comprises a bipolar transistor, the base-emitter junction of which is connected in parallel with said resistance.

3. The current limiting circuit of claim 2 wherein the amplitude of said compensation current varies as a function of temperature to compensate for temperature induced variations in the base to emitter on voltage of said bipolar transistor.

4. The current limiting circuit of claim 3 wherein, at temperatures greater than a preselected temperature, the value of said compensation current is zero and, at temperatures less than said preselected temperature, the value of said compensation current varies as a function of temperature in a manner to ensure that the maximum current in said first IGFET is constant as a function of temperature.

5. A method of limiting the maximum amplitude of a first current flowing through the source and drain terminals of a first IGFET to no greater than a preselected value, said method comprising the steps of:

(a) causing said first current to also flow through a resistance, (b) limiting the voltage across said resistance at a preselected temperature to no greater than a predetermined value, and (c) injecting a compensation current into a terminal of said resistance and causing said compensation current to vary in amplitude as a function of temperature so as to cancel temperature induced variations in the maximum amplitude of said first current;

(d) causing an additional current to flow through the source and drain terminals of a second IGFET and wherein said additional current is proportional to and greater than said first current; the first IGFET is a sensefet of said second IGFET.

6. The method of claim 5 further comprising the step of causing the value of said compensation current to be zero for temperatures above a preselected temperature.

* * * * *

UNITED STATES PATENT AND TRADEMARK OFFICE
CERTIFICATE OF CORRECTION

PATENT NO.    : 6,307,726 B1
DATED         : October 23, 2001
INVENTOR(S)   : Andrew Marshall, Ching L. Lin, Jingwei Xu It is certified that error appears in the above-identified patent and that said Letters Patent is hereby corrected as shown below:

<u>Title page,</u>
Insert Item [60], Related U.S. Application Data, -- Provisional Application No. 60/102,852 Oct. 2, 1998. --

Signed and Sealed this

Twenty-sixth Day of March, 2002

Attest:

*Attesting Officer*

JAMES E. ROGAN
*Director of the United States Patent and Trademark Office*